United States Patent [19]
Ohmi et al.

[11] Patent Number: 5,850,853
[45] Date of Patent: Dec. 22, 1998

[54] FLUID CONTROL SYSTEM AND VALVE TO BE USED THEREIN

[75] Inventors: Tadahiro Ohmi, 2-1-17-301, Komegafukuro, Aoba-ku, Sendai-shi, Miyagi-ken; Michio Yamaji, Osaka; Nobukazu Ikeda, Osaka; Hiroshi Morokoshi, Osaka, all of Japan

[73] Assignees: Fujikin Incorporated; Tadahiro Ohmi, both of JPX

[21] Appl. No.: 630,081

[22] Filed: Apr. 9, 1996

[30]    Foreign Application Priority Data

Jul. 14, 1995 [JP] Japan .................................. 7-178374

[51] Int. Cl.$^6$ .................................................. F16K 31/42
[52] U.S. Cl. ..................... 137/606; 251/30.01; 251/335.2
[58] Field of Search .................. 137/606; 251/30.01, 251/335.2

[56]    References Cited

U.S. PATENT DOCUMENTS

| | | | |
|---|---|---|---|
| 4,558,845 | 12/1985 | Hunkapiller | 137/606 X |
| 4,624,441 | 11/1986 | Kreitchman et al. | 251/30.01 |
| 4,703,913 | 11/1987 | Hunkapiller | 137/606 X |
| 4,741,354 | 5/1988 | DeMild | 137/606 X |
| 4,874,014 | 10/1989 | Grant et al. | 137/606 |
| 5,178,366 | 1/1993 | Kojima et al. | 251/335.2 |

FOREIGN PATENT DOCUMENTS 63-88387   4/1988   Japan .................................. 251/30.01

*Primary Examiner*—Stephen M. Hepperle
*Attorney, Agent, or Firm*—Griffin, Butler, Whisenhunt & Szipl, LLP

[57]    ABSTRACT

A fluid control system, and its valve assemblies, are used to control the feeding of fluids accurately (by operating (opening and closing) valves promptly and accurately), for the manufacture of semiconductors, magnetic thin films, biotechnical products, and other products. The fluid control system comprises a principal control line (L) and plural branch control lines ($L_1$, $L_2$, . . . ) for feeding plural types of fluid ($G_1$, $G_2$, . . . ) into a processing device (C) coupled to the principal control line, and plural valve assemblies (V) incorporated in the branch control lines ($L_1$, $L_2$, . . . ) for switching the fluids ($G_1$, $G_2$, . . . ) supplied into the processing device (C). Each of the valve assemblies (V) comprises a fluid drive valve (V') having a fluid pressure actuator (1), and an electromagnetic valve (V") integrally attached, in single housing, substantially without hoses, to the fluid drive valve (V') to feed a working fluid (A) into the fluid pressure actuator (1).

6 Claims, 4 Drawing Sheets

FLUID CONTROL SYSTEM AND VALVE TO BE USED THEREIN

BACKGROUND OF THE INVENTION

The present invention relates to a fluid control system for feeding various fluids into a processing device and to a type of valve used therein, the fluid control system being used for manufacturing semiconductors, magnetic thin films, biotechnical products, pharmaceuticals, and other products; and more particularly the invention relates to such a fluid-control-system valve capable of accurately controlling the flow of various fluids into the processing device by operating many such valves promptly and accurately with electrical signals.

FIG. 4 shows an example of a conventional prior art fluid control system used in the manufacture of semiconductors. This fluid control system includes a principal control line L and branch control lines $L_1$ to $L_5$ for feeding several types of fluid $G_1, G_2, G_3, G_4, G_5$ into a processing device (process chamber for processing the wafers) C, and plural valve assemblies V''' incorporated in the branch control lines $L_1$ to $L_5$ for switching the fluids $G_1, G_2, G_3, G_4, G_5$ supplied to the process chamber C.

In FIG. 4, $L_6$ denotes a vacuum exhaust line connected to the process chamber C, $P_1$ is a vacuum pump connected to the vacuum exhaust line $L_6$, $L_7$ is a vent line connected to the principal control line L, $P_2$ is a vacuum pump connected to the vent line $L_7$, and $V_1, V_2, V_3$ are valves.

The valve assemblies V''' are blocks of valves, in structures of integrally combined plural metal diaphragm valves (that is, metal diaphragm valves in a single body structure), or other types of valves, and they are designed to be worked by fluid pressure actuators (fluid pressure cylinders and pistons). That is, the valve assemblies V''' include fluid driven valves.

Each valve of each valve assembly V''' is connected, via a tube T to a valve of an electromagnetic valve assembly EV for feeding working fluid to it, and it is designed to operate when its electromagnetic valve is opened for feeding a working fluid A into a fluid pressure actuator through the respective tube T.

The valves of the electromagnetic valve assembly EV are assembled at a single place in a block structure, having one inlet and plural outlets, and each outlet is connected to a fluid pressure actuator of a valve of a valve assembly V''' through a respective tube T.

Therefore, in this fluid control system, the working fluid A is supplied to each valve of a valve assembly V''' from its electromagnetic valve through its tube T, and each valve assembly V''' is thereby properly controlled to open or close, so that an individual one, or a mixture of some, of the fluids $G_1, G_2, G_3, G_4, G_5$ is/are supplied to the process chamber C through the valve assemblies V'''.

In such fluid control systems, an action response time of each valve assembly V''' to an operation signal depends upon an action response time of each valve of the valve assembly V''' itself, and a time for feeding the working fluid A. That is, the action response time of each valve assembly V''' is the sum of time elapsing from before a respective valve of the electromagnetic valve assembly EV is opened by an operation signal, the working fluid is supplied to a respective valve of the valve assembly V''' from the electromagnetic valve through the tube T, and the valve itself is opened (or closed).

In this fluid control system, however, since an air actuator of each valve of each valve assembly V''', and its respective valve of the electromagnetic valve assembly EV, are connected through a tube T, it takes an undue amount of time before the working fluid is supplied; thus operation (opening or closing) of the valves of the valve assembly V''' cannot be done promptly.

Further, lengths of the tubes T for connecting the valves of the valve assemblies V''' with their electromagnetic valves EV vary with the result that differences in action response times of the valve assemblies occur. As a result, when a mixture of several different types of fluids is supplied, for example by using normally closed valves, the plural valves of the valve assemblies V''' cannot be opened promptly and simultaneously, and it takes a considerably long time before the mixing ratio of these fluids is stabilized. This period is "lost time", and the fluids used are wasted. Similarly, when a feeding of mixed gasses uses normally open valves, the valves of the valve assemblies V''' cannot be closed promptly and simultaneously, and the fluids used are wasted. The fluids for manufacturing semiconductors are very expensive, and this is, therefore, a serious economic problem.

Furthermore, if the working fluid A is discharged simultaneously from plural outlets of the electromagnetic valve EV, the working fluid A may be insufficient, and a pressure drop may occur. As a result, differences in action response times due to pressure decline of the working fluid A may occur.

Thus, in this conventional fluid control system, since the plural valves of the valve assemblies V''' cannot be promptly, accurately and simultaneously operated (opened and closed), it is hard to accurately control the feeding of fluids $G_1, G_2, G_3, G_4, G_5$ into the process chamber C.

It is an object of this invention to provide a fluid control system, for operating (opening and closing) valves accurately and promptly, and thereby controlling the feeding of fluids accurately, for use in manufacturing semiconductors, magnetic thin films, biotechnical products, pharmaceuticals, and other products.

SUMMARY OF THE INVENTION

According to principles of this invention, a fluid control system comprising a principal control line and plural branch control lines, coupled to the principal central line, for feeding plural types of fluids into a processing device has plural valve assemblies incorporated in the branch control lines for switching the fluids supplied to the processing device, with each of the valve assemblies including a fluid drive valve driven by a fluid pressure actuator, and an electromagnetic valve being integrally attached (in a single integral housing with no hoses) to the fluid drive valve so as to feed working fluid into the fluid pressure actuator.

According to aspects of the invention, the valve assembly comprises: the fluid drive valve including a body having an inflow passage, an outflow passage, a valve chamber, and a valve seat; a stem movably supported by the body; a disk (or diaphragm) contacting or separating from the valve seat of the body caused by ascending and descending motion of the stem; a fluid pressure actuator provided beside the body for moving the stem up and down; and an electromagnetic valve. The electromagnetic valve includes: an electromagnetic-valve body defining an inlet, an outlet, an electromagnetic-valve chamber, and an electromagnetic-valve seat, and being integrally attached to the fluid pressure actuator so that its outlet communicates with the fluid pressure actuator; a plunger slidably supported by the electromagnetic-valve body; a disk attached to the plunger for coming into contact with, and separating from, the electromagnetic valve seat; a spring for thrusting the plunger in a valve closing direction so that the disk is normally in contact with the valve seat; a core positioned above the plunger; and an excitation coil surrounding the core.

In this fluid control system, when the electromagnetic valve is opened by an electric signal energizing the electromagnetic valve, it supplies a working fluid into the fluid pressure actuator of the fluid drive valve along a shortest possible route through the inlet, electromagnetic-valve chamber, and output of the electromagnetic-valve body, thereby actuating the fluid pressure actuator. As a result (in the case of a normally closed fluid drive valve), the fluid drive valve is opened and the fluid is supplied into the processing device. In the case of a normally open type fluid drive valve, the fluid drive valve is thereby closed so that supply of fluid into the processing device is stopped.

In this fluid control system, plural valves of this structure (the structure of an electromagnetic valve directly coupled with a fluid drive valve) are incorporated into the branch control lines, or into a branch control line and the principal control line, for feeding plural types of fluids into the processing device. As a result, each fluid drive valve can be operated (opened and closed) promptly and accurately, and the feeding of fluids into the processing device can be accurately controlled. Hence, the quality of semiconductors produced therewith is improved, and troubles due to reverse flow or reverse diffusion of fluids are eliminated.

BRIEF DESCRIPTION OF THE DRAWING

The invention is described and explained in more detail below using the embodiments shown in the drawings. The described and drawn features, in other embodiments of the invention, can be used individually or in preferred combinations. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DESCRIPTION OF THE PREFERRED EMBODIMENT

Figure 1:
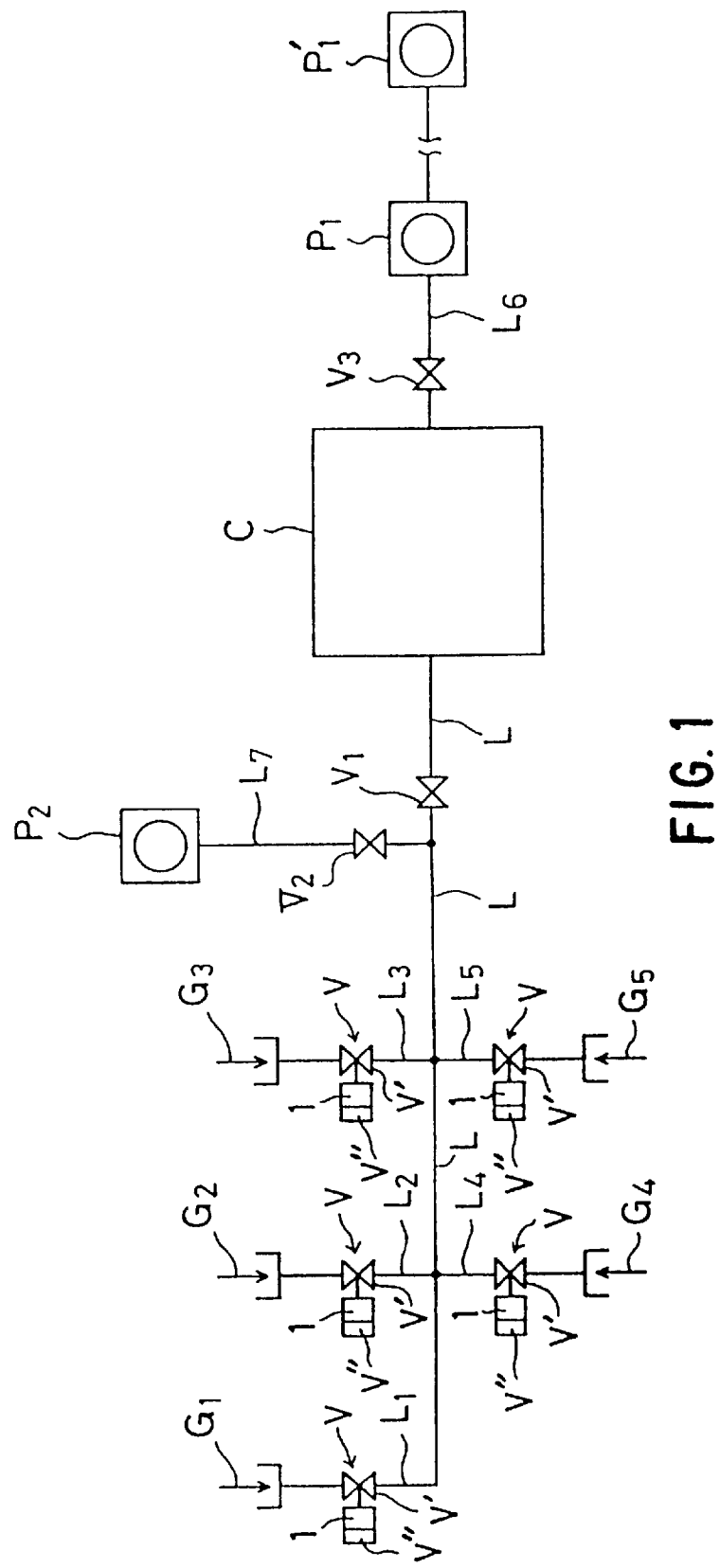
FIG. 1 is a schematic block diagram showing an example of a fluid control system for semiconductor manufacturing apparatus in one embodiment of this invention.

Referring now to the drawings, an embodiment of the invention is described in detail below.

FIG. 1 is a schematic block diagram of a fluid control system for semiconductor manufacturing apparatus according to an embodiment of the invention, with this fluid control system being composed of a principal control line L and plural branch control lines $L_1$, $L_2$, $L_3$, $L_4$, $L_5$ for feeding plural types of fluid $G_1$, $G_2$, $G_3$, $G_4$, $G_5$ into a processing device C, i.e. into a process chamber for processing wafers; there being plural valve assemblies V incorporated in the branch control lines $L_1$, $L_2$, $L_3$, $L_4$, $L_5$ for switching the fluids $G_1$, $G_2$, $G_3$, $G_4$, $G_5$ being supplied into the processing chamber C.

In FIG. 1, while L is a principal control line, and $L_1$ to $L_5$ are branch control lines, $L_6$ is a vacuum exhaust line connected to the process chamber C (i.e. the processing device), $P_1$ is a vacuum pump of high vacuum type (for example, a turbo molecular pump) disposed at a chamber C end of the vacuum exhaust line $L_6$, $P'_1$ is a vacuum pump of low vacuum type (for example, a rotary pump or dry pump) disposed on the vacuum exhaust line $L_6$ at an atmospheric end remote from the chamber C, $L_7$ is a vent line connected to the fluid principal control line L, $P_2$ is a vacuum pump (rotary pump) connected to the vent line $L_7$, and $V_1$ to $V_3$ are valves for opening and closing.

Liquid (liquefied gas) or gas (vaporized gas) may be used as the fluids $G_1$, $G_2$, ... in FIG. 1.

The valve assemblies V are each composed of a fluid drive valve V' having a fluid pressure actuator 1, and an electromagnetic valve V" integrally attached to the fluid drive valve V' for feeding working fluid A into the liquid pressure actuator 1.

Oil pressure, water pressure, gas pressure (of nitrogen gas or the like), air pressure, or the like, can be employed in the liquid pressure actuator.

More specifically, the fluid drive valve V' comprises a body 2 (FIG. 2) having a valve seat 2d provided in the bottom of a valve chamber 2c of concave form communicating with an inflow passage 2a and an outflow passage 2b, a bellows flange 3 disposed at an upper portion of the valve chamber 2c, a tubular bonnet 4 disposed on the upper surface of the bellows flange 3, a bonnet nut 5 screwed on the body 2 for tightening and fixing the bellows flange 3 and bonnet 4 to a side of the body 2, a stepped stem 6 movably inserted and supported in the bellows flange 3 and bonnet 4 with a lower end thereof being positioned in the valve chamber 2c), a disk 7 fixed to the lower end of the stem 6 for contacting and moving away from the valve seat 2d, metal bellows 8 having opposite ends hermetically affixed to the bellows flange 3 and the lower end of the stem 6 by welding, a valve closing spring 10 interposed between the bonnet 4 and a spring retainer 9 engaged with the stem 6 (for thrusting the stem 6 downward so that the disk 7 contacts the valve seat 2d), and the fluid pressure actuator 1 having a cylinder/piston structure at the bonnet 4 for driving the stem 6 upwardly with the working fluid A; the fluid drive valve V' being a normally closed valve.

The fluid pressure actuator 1 comprises a cylinder 11 forming a cylinder chamber, a piston 12 disposed slidably in the cylinder 11, and a piston cap 13 attached to the piston 12. The fluid pressure actuator 1 is designed to drive the stem 6 upwardly with working fluid A.

Oil, water, nitrogen gas, air, or the like may be used as the working fluid A, but air is used as the working fluid A in this embodiment.

Providing a more detailed description, the cylinder 11 is hermetically fixed to an upper part of the bonnet 4 by means of a stop ring 14, a washer 15, and an O-ring 16, and is composed of an actuator body 11' having a nearly tubular form with its bottom end surrounding an upper end of the stem 6 projecting from the body 2, and a cap 11" screwed on the actuator body 11' for capping its opening. The cylinder chamber is formed inside the cylinder 11. A first feed port 11a is formed at an outer circumferential end portion of the cap 11", which opens at a side and at an upper end of the cylinder 11. A second feed port 11b is formed in the middle of the cap 11", for communicating with the cylinder chamber.

The piston 12 is attached to the upper end of the stem 6 by an E-ring 17 and a collar 18, and the piston 12 is designed to slide in a vertical direction in the cylinder chamber on an O-ring 19 fitted on the outer circumference at this piston 12. The piston 12 has a communicating hole 12a for bringing into communication upper and lower parts of the cylinder chamber, which is, thusly, split in the vertical direction.

The piston cap 13 has a nearly inverted T form in its sectional shape, and it is fixed to an upper surface of the piston 12 by a screw 20, and its upper end is sealingly (hermetically) inserted into the second feed port 11b of the cap 11" to be slidable therein. A penetration hole 13a is formed in a central part of the piston cap 13 for communicating between the second feed port 11b of the cap 11" and the communicating hole 12a of the piston 12.

Thus, for the fluid drive valve V', when working fluid is supplied into the lower part of the cylinder chamber through the second feed port 11b, the penetration hole 13a and the communicating hole 12a, the piston 12 goes up, and the stem 6 also rises, overcoming an elastic force of the valve closing spring 10, thereby separating the disk 7 from the valve seat 2d and communicating the inflow passage 2a with the outflow passage 2b (valve open state).

When the supply of the working fluid A is stopped and the cylinder chamber is exhausted, an elastic force of the valve closing spring 10 forces the piston 12 and the stem 6 to move downwardly, thereby forcing the disk 7 to contact the valve seat 2d, closing communication between the inflow passage 2a and the outflow passage 2b.

On the other hand, the electromagnetic valve V" is attached to an upper surface of the cap 11" of the fluid pressure actuator 1, and comprises a body 21 having an inlet 21a communicating and with the first feed port 11a, an outlet 21b communicating with the second feed port 11b, a valve chamber 21c communicating with the inlet 21a and outlet 21b, a valve seat 21d formed in the valve chamber 21c, a coil case 22 provided at the upper surface of the body 21, a lid body 23 for covering the valve chamber 21c, a tubular plunger 24 elevatably (slidably) supported on the lid body 23 with its lower end being inserted in the valve chamber 21c, a first disk 25 at the lower end of the plunger 24 for contacting and separating from the valve seat 21d, a core 26 disposed above the plunger 24 and forming an exhaust hole 26a, an excitation coil 27 provided around the core 26, a lead wire 28 connected to the excitation coil 27, and a spring 29 for thrusting the plunger 24 downwardly so that the first disk 25 is on the valve seat 21d. This electromagnetic valve V" is normally closed.

Figure 2:
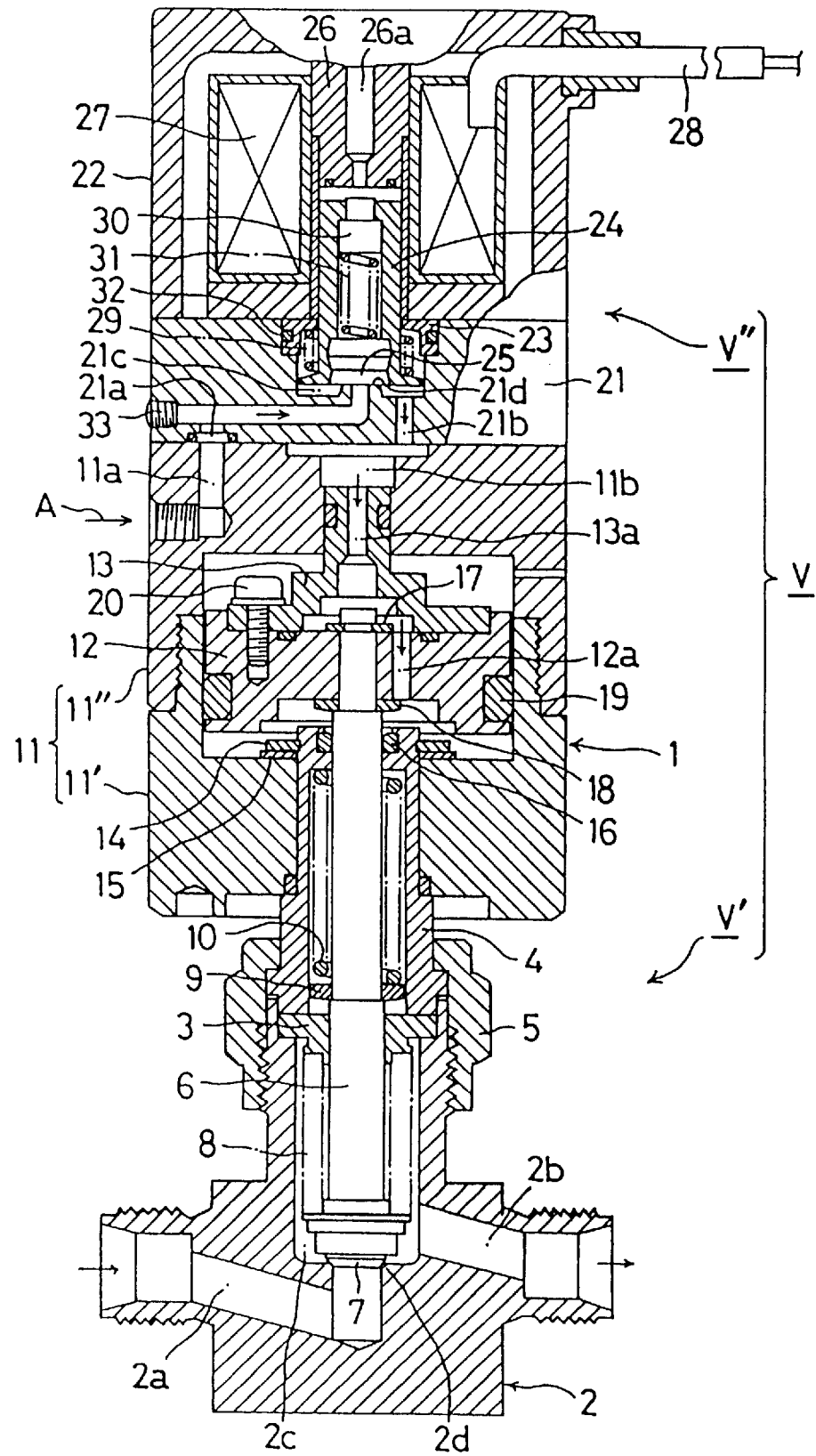
FIG. 2 is an enlarged vertical cross-sectional view of a first-embodiment switching valve assembly used in the fluid control system of FIG. 1.

In FIG. 2, a second disk 30 is disposed in the plunger 24, for opening and closing the exhaust port 26a, 31 being a spring for thrusting the second disk 30, 32 being an O-ring, and 33 being a blind plug.

In the electromagnetic valve V", when the excitation coil 27 is excited by turning on an electric current, the plunger 24 is pulled up toward the core 26, overcoming an elastic force of the spring 29, and the first disk 25 is separated from the valve seat 21d. As a result, the working fluid A, supplied from the first feed port 11a into the inlet 21a is supplied into the second feed port 11b through the valve chamber 21c and the outlet 21b, thereby actuating the fluid pressure actuator 1 of the fluid drive valve V'.

When excitation of the excitation coil 27 is cut off, the plunger 24 falls, due to the elastic force of the spring 29, and the first disk 25 comes to rest on the valve seat 21d. As a result, the electromagnetic valve V" is closed, and supply of the working fluid A into the fluid pressure actuator 1 is stopped.

Thus constituted, the valves assemblies V are incorporated into branch control lines $L_1$ to $L_5$ to control communication therethrough to the process chamber C. That is, the inflow passage 2a and outflow passage 2b of the fluid drive valve V' are connected to the branch control lines $L_1$ to $L_5$ for controlling communication therethrough to the process chamber C, and the first feed port 11a of the fluid pressure actuator 1 is connected to a fluid supply source (not shown) through a tube (not shown).

A compressor, a pressurized air storage tank, a nitrogen gas cylinder, a hydraulic pump, and other sources may be used as the fluid supply source. A valve assembly V may also be incorporated into the principal control line L.

When mixing plural types of fluids and feeding a mixture thereby produced into the process chamber C with this fluid control system, provided with these plural valve assemblies V, the electromagnetic valves V" of the plural valve assemblies V are opened by electronic control signals. That is, when the excitation coil 27 of each electromagnetic valve V" is excited, its plunger 24 is pulled upwardly toward its core 26, overcoming the elastic force of its spring 29, and its first disk 25 is separated from its valve seat 21d. As a result, the working fluid A supplied from the fluid supply source into the first feed port 11a through the tube is supplied into the second feed port 11b of the fluid pressure actuator 1, from the inlet 21a of the electromagnetic valve V" through valve chamber 21c and outlet 21b and flows from the second feed port 11b through the penetration hole 13a and communicating hole 12a, and is supplied into the lower part of the cylinder chamber.

When the working fluid is supplied into the lower part of the cylinder chamber, the piston 12 ascends, and, accordingly, the stem 6 rises, overcoming the elastic force of the valve closing spring 10, and the disk 7 is separated from the valve seat 2d. Thusly, a plurality of fluid drive valves V' can be opened, and several types of fluids can be supplied into the process chamber C in a mixed state.

In the fluid control system of the invention, each of the valve assemblies V comprises the fluid drive valve V' having the fluid pressure actuator 1, and the electromagnetic valve V" for feeding fluid into the fluid pressure actuator 1. Since the electromagnetic valve V" is directly coupled (by a unitary housing with substantially no hoses) to the fluid drive valve V', the working fluid A is immediately supplied into the fluid drive valve V' when the electromagnetic valve V" is opened, and hence the fluid drive valve V' is operated (opened and closed). That is, the valve assembly V is operated (opened or closed) promptly.

Since each valve assembly V is structured such that the electromagnetic valve V" is directly coupled (by a unitary or block housing) with the fluid drive valve V', the lengths of working fluid A feed routes to all the valve assemblies V is the same, and there are no differences between the valves assemblies in regard to action response times. As a result, when mixing several types of fluids for use, the multiple valve assemblies V can be opened promptly and accurately, mixing ratios of fluids can be immediately stabilized, and there is no waste of fluids. Still further, since each valve assembly V has an electromagnetic valve V", it does not run short of working fluid A and a pressure drop does not occur. Differences in action time due to pressure drops of the working fluid A can also be prevented.

In this way, the plural valve assemblies V of this fluid control system can be operated promptly and accurately, and supply of fluids into the processing device C can be controlled accurately.

Figure 3:
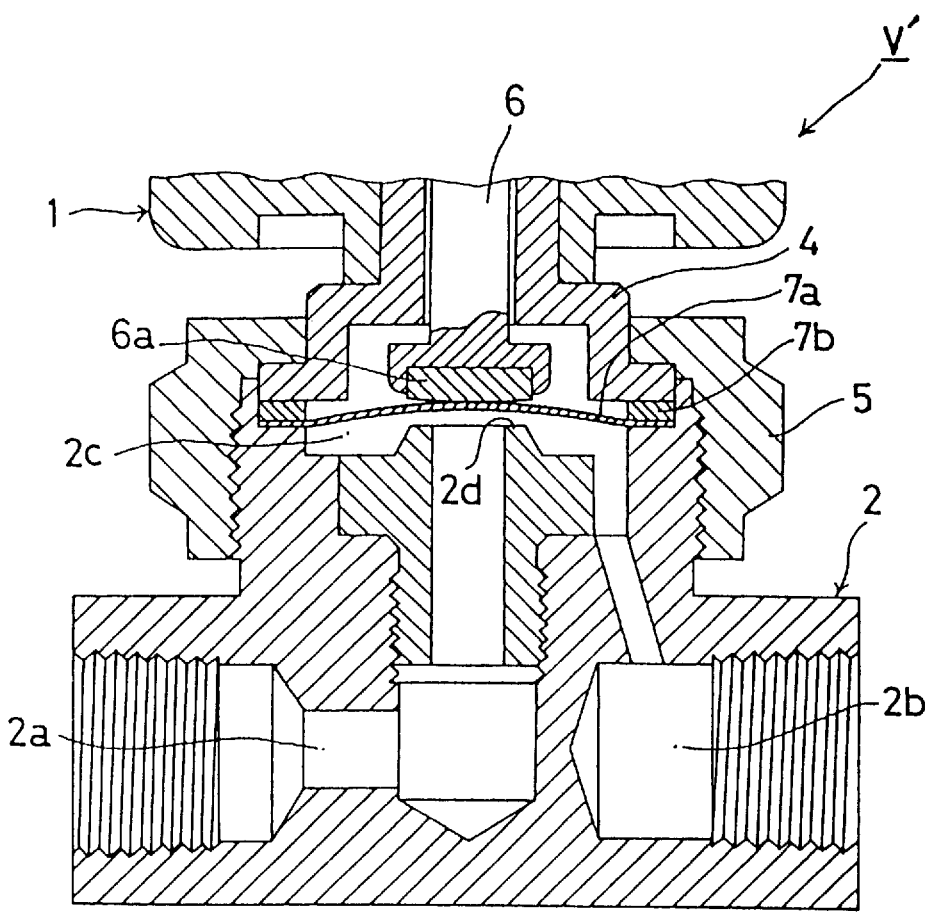
FIG. 3 is a segmented, enlarged, vertical cross-sectional view of a second-embodiment switching valve assembly used in the fluid control system of FIG. 1; and, FIG. 4 is a schematic block diagram showing an example of a conventional, prior-art, fluid control system.
Figure 4:
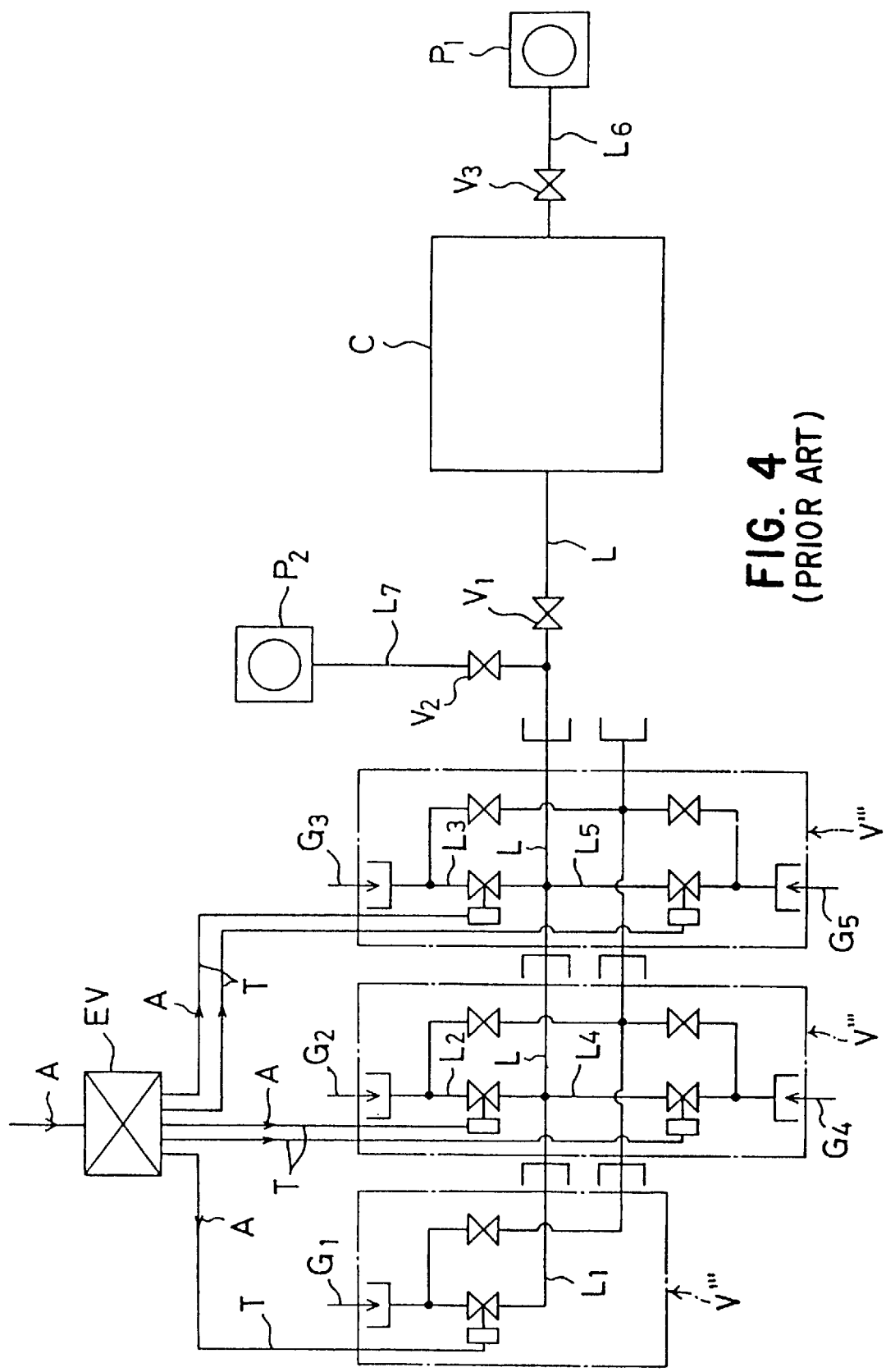

In this embodiment, a bellows valve is used as the fluid drive valve V', to which the electromagnetic valve V" is directly coupled; but in another embodiment, a metal diaphragm valve of direct touch type, as shown in FIG. 3, may be used as the fluid drive valve V', to which the electromagnetic valve V" of FIG. 2 may also be coupled directly.

Looking at FIG. 3, 7a is a diaphragm made of thin metal plate (stainless steel plate, etc.), 7b is packing, and 6a is a diaphragm holder fixed at a lower end of the stem 6. By pushing the diaphragm 7a to the valve seat 2d by means of the diaphragm holder 6a, a fluid passage is closed. When the stem 6 is pulled upwardly, the diaphragm 7a, which has been pushed downwardly is pushed upwardly by elastic force, and the fluid passage is opened.

In the foregoing embodiment, the valve assembly V is constituted such that the electromagnetic valve V" is directly coupled with the fluid drive valve V' in a single structure, but in another embodiment, the valve assembly V may also have plural electromagnetic valves V" directly coupled to a block valve assembly having plural fluid pressure actuators 1.

In the foregoing embodiment, an actuator of cylinder/piston structure is used as the fluid pressure actuator 1 of the fluid drive valve V', but in other embodiments, actuators of diaphragm structure or bellows structure may be used as the fluid pressure actuator 1.

In the foregoing embodiment, the fluid drive valve V' is of a normally closed type, but in other embodiments, it may be a normally open type. In that case, too, the valve assembly V would be operated promptly and accurately in the same manner as in the above described embodiments.

According to this invention, a fluid control system employs a plurality of valve assemblies, each having a structure for directly coupling an electromagnetic valve with a fluid driven valve, in branch control lines and, via a principal control line, for feeding several types of fluids into a processing device. Thus, operation (opening and closing) of each valve assembly can be controlled promptly and accurately. As a result, fluid supply into the processing device can be controlled accurately so that the quality of products processed is improved and troubles due to reverse flow, or reverse diffusion of fluids, are eliminated.

While the invention has been particularly shown and described with reference to a preferred embodiment, it will be understood by those of ordinary skill in the art that various changes in form and detail may be made therein without departing from the spirit and scope of the invention.

The invention claimed is:

1. A fluid control system comprising a principal control line and plural branch control lines for feeding plural types of fluids into the principal control line, with a processing device being attached to the principal control line, and plural valve assemblies in the branch control lines for switching the fluids supplied to the processing device, wherein each of the valve assemblies comprises:

a fluid drive valve comprising a body defining an inflow passage, an outflow passage, a first valve chamber, and a first valve seat; a stem running through the first valve chamber and supported to be movable in the vertical direction; a disk engaged with the stem for being brought into contact with and moved away from the first valve seat by motion of the stem; a valve closing spring thrusting the stem in the downward direction; a cylinder fixed to the upper portion of the body for forming a fluid pressure actuator;

a piston provided in the cylinder, slidingly movable in the vertical direction and fixing the upper end of the stem; a first feed port opening in the upper face of the cylinder for introducing a working fluid fed from the side of the cylinder; a second feed port penetrating through the upper face of the cylinder; a piston cap which is fixed to the upper face of the piston and whose upper portion is slidably inserted in a penetration hole communicating with the second feed port; a penetration hole provided in the piston cap for introducing the working fluid from the second feed port into the lower space of the piston and a communicating hole provided in the piston, and an electromagnetic valve comprising a body defining an inlet, an outlet, a second valve chamber, and a second valve seat and integrally attached to the upper side of the cylinder of the fluid pressure actuator, with the inlet being connected to the first feed port provided in the upper face of the cylinder and the outlet being connected to the second feed port provided in the upper face of the cylinder; a plunger slidably supported by the body; a disk on the plunger for contacting and moving away from the second valve seat; a spring for thrusting the plunder in the valve closing direction in which the disk contacts the second valve seat; a magnetic core above the plunger; an exciting coil surrounding the magnetic core; and a coil case enclosing the excitation coil.

2. A valve assembly comprising a fluid drive valve having a first body defining an inflow passage, an outflow passage, a first valve chamber, and a first valve seat; a stem running through the first valve chamber and supported to be movable in the vertical direction; a disk engaged with the stem for being brought into contact with and moved away from the first valve seat by motion of the stem; a valve closing spring thrusting the stem in the downward direction; a cylinder fixed to the upper portion of the body for forming a fluid pressure actuator; a piston provided in the cylinder, slidingly movable in the vertical direction and fixing the upper end of the stem; a first feed port opening in the upper face of the cylinder for introducing a working fluid fed from the side of the cylinder; a second feed port penetrating through the upper face of the cylinder; a piston cap which is fixed to the upper face of the piston and whose upper portion is slidably inserted in a penetration hole communicating with the second feed port; a penetration hole provided in the piston cap for introducing the working fluid from the second feed port into the lower space of the piston; and a communicating hole provided in the piston; and an electromagnetic valve composed of a second body having an inlet, an outlet, a second valve chamber, a second valve seat; wherein the outlet is integrally connected to the upper side of the cylinder of the fluid pressure actuator, with the inlet being connected to the first feed port provided in the upper face of the cylinder and the outlet being connected to the second feed port provided in the upper face of the cylinder; and wherein said electromagnetic valve has a plunger slidably supported by the second body, a disk on the plunger for contacting and separating from the second valve seat, a spring for thrusting the plunger in a valve closing direction in which the disk contacts the second valve seat, a magnetic core above the plunger, an excitation coil surrounding the core for causing the plunger to move, and a coil case enclosing the excitation coil.

3. A valve assembly comprising a fluid drive valve having a first body defining an inflow passage, an outflow passage, a first valve chamber, and a first valve seat; a stem running through the first valve chamber and supported to be movable in the vertical direction; a metal diaphragm engaged with the stem for being brought into contact with and moved away from the first valve seat by motion of the stem; a cylinder fixed to the upper portion of the body for forming a fluid pressure actuator;

a piston provided in the cylinder, slidingly movable in the vertical direction and fixing the upper end of the stem; a first feed port opening in the upper face of the cylinder for introducing a working fluid fed from the side of the cylinder; a second feed port penetrating through the upper face of the cylinder; a piston cap which is fixed to the upper face of the piston and whose upper portion is slidably inserted in a penetration hole communicating with the second feed port; a penetration hole provided in the piston cap for introducing the working fluid from the second feed port into the lower space of the piston; and a communicating hole provided in the piston, and an electromagnetic valve composed of a second body having an inlet, an outlet, a second valve chamber, and a second valve seat; wherein the outlet is integrally connected to the upper side of the cylinder of the fluid pressure actuator, with the inlet being connected to the first feed port provided in the upper face of the cylinder and the outlet being connected to the second feed port provided in the upper face of the cylinder, and wherein said electromagnetic valve has a plunger slidably supported by the second body, a disk on the plunger for contacting and separating from the second valve seat, a spring for thrusting the plunger in a valve closing direction in which the disk contacts the second valve seat, a magnetic core above the plunger, an excitation coil surrounding the core, and a coil case enclosing the excitation coil.

4. A valve assembly as claimed in claim 3 wherein an exhaust hole is bored in the center of the magnetic core and a second disk and a spring for thrusting the second disk in the upward direction are provided in the center hole of the plunger, wherein a lower end of the exhaust hole is sealed by the second disk when the first disk is moved away from the second valve seat.

5. A valve assembly as claimed in claim 4 wherein an exhaust hole is bored in the center of the magnetic core and a second disk and a spring for thrusting the second disk in the upward direction are provided in the center hole of the plunger, wherein a lower end of the exhaust hole is sealed by the second disk when the first disk is moved away from the second valve seat.

6. A fluid control system comprising a principal control line and plural branch control lines for feeding plural types of fluids into the principal control line, with a processing device being attached to the principal control line, and plural valve assemblies in the branch control lines for switching the fluids supplied to the processing device, wherein each of the valve assemblies comprises:

a fluid drive valve comprising a body defining an inflow passage, an outflow passage, a first valve chamber, and a first valve seat; a stem running through the first valve chamber and supported to be movable in the vertical direction; a metal diaphragm contacting and moving away from the valve seat of the body in accordance with the vertical movement of the stem; a cylinder fixed to the upper portion of the body for forming a fluid pressure actuator; a piston provided in the cylinder, slidingly movable in the vertical direction and fixing the upper end of the stem; a first feed port opening in the upper face of the cylinder for introducing a working fluid fed from the side of the cylinder; a second feed port penetrating through the upper face of the cylinder; a piston cap which is fixed to the upper face of the piston and whose upper portion is slidably inserted in a penetration hole communicating with the second feed port; a penetration hole provided in the piston cap for introducing the working fluid from the second feed port into the lower space of the piston and a communicating hole provided in the piston, and an electromagnetic valve comprising a body defining an inlet, an outlet, a second valve chamber, and a second valve seat and integrally attached to the upper side of the cylinder of the fluid pressure actuator, with the inlet being connected to the first feed port provided in the upper face of the cylinder and the outlet being connected to the second feed port provided in the upper face of the cylinder; a plunger slidably supported by the body; a disk on the plunger for contacting and moving away from the second valve seat; a spring for thrusting the plunder in the valve closing direction in which the disk contacts the second valve seat; a magnetic core above the plunger; an exciting coil surrounding the magnetic core; and a coil case enclosing the excitation coil.

* * * * *